United States Patent
Ishii et al.

(10) Patent No.: US 7,843,136 B2
(45) Date of Patent: Nov. 30, 2010

(54) ORGANIC ELECTROLUMINESCENCE DISPLAY DEVICE HAVING A DESICCANT ON GLASS PLATE

(75) Inventors: Yoshinori Ishii, Chiba (JP); Satoru Kase, Mobara (JP)

(73) Assignee: Hitachi Displays, Ltd., Chiba-Ken (JP)

( * ) Notice: Subject to any disclaimer, the term of this patent is extended or adjusted under 35 U.S.C. 154(b) by 539 days.

(21) Appl. No.: 11/762,839

(22) Filed: Jun. 14, 2007

(65) Prior Publication Data
US 2007/0290609 A1 Dec. 20, 2007

(30) Foreign Application Priority Data
Jun. 19, 2006 (JP) ............... 2006-168779

(51) Int. Cl.
*H01J 17/49* (2006.01)
*H01J 1/62* (2006.01)

(52) U.S. Cl. ............ 313/512; 313/483; 313/500; 313/503; 313/504; 313/505; 313/506

(58) Field of Classification Search .......... None
See application file for complete search history.

(56) References Cited

U.S. PATENT DOCUMENTS

| 7,178,927 B2 * | 2/2007 | Seo ............... 362/84 |
| 2005/0046344 A1 * | 3/2005 | Lee et al. ............ 313/504 |
| 2008/0203909 A1 * | 8/2008 | Azuma ............. 313/504 |

FOREIGN PATENT DOCUMENTS

| JP | 03-261091 | 11/1991 |
| JP | 2001-345175 | 12/2001 |
| JP | 2008210648 A * | 9/2008 |

OTHER PUBLICATIONS

Korean Patent Publication No. 10-2006-0013455 (publication date Feb. 10, 2006).

* cited by examiner

*Primary Examiner*—Nimeshkumar D Patel
*Assistant Examiner*—Natalie K Walford
(74) *Attorney, Agent, or Firm*—Antonelli, Terry, Stout & Kraus, LLP.

(57) ABSTRACT

There is disclosed a construction which facilitates preventing of organic electroluminescence films from being broken by contact between desiccant members and the organic electroluminescence films which are provided inside an organic electroluminescence display device. Organic electroluminescence films are formed on a substrate. An interior of an organic electroluminescence display device is sealed by a rear glass plate which is sealingly bonded to the substrate. The rear glass plate has recess portions in which desiccant members are mounted by double-side adhesive tapes. Thick portions are provided between respective adjacent recess portions of the rear glass plate, whereby the rear glass plate is prevented from being made to flex, and contact between the desiccant members and the organic electroluminescence films formed on the substrate is prevented.

13 Claims, 9 Drawing Sheets

B-B

A-A

B-B

B-B

A-A

ORGANIC ELECTROLUMINESCENCE DISPLAY DEVICE HAVING A DESICCANT ON GLASS PLATE

CLAIM OF PRIORITY

The present application claims priority from Japanese Application JP 2006-168779 filed on Jun. 19, 2006 the content of which is hereby incorporated by reference into this application.

BACKGROUND OF THE INVENTION (1) Field of the Invention

The present invention relates to organic electroluminescence display devices and, more particularly, to a technique for sealing an organic electroluminescence display device in order to prevent degradation of an organic EL material which is brought about by moisture.

(2) Description of the Related Art

Hitherto, of display devices, CRT display devices were dominant. However, in lieu of the CRT display devices, flat display devices such as liquid crystal display devices, plasma display devices and the like have come in practice, and the demand has arisen for the flat display devices. Moreover, in addition to these display devices, the development and practical application of a display device utilizing an organic electroluminescence technology (hereinafter referred to as "organic EL display device") and a display device in which electron sources utilizing a field emission technology are arranged in matrix form and phosphors arranged at a positive electrode are made bright, whereby an image is produced (hereinafter referred to as "FED display device") have progressed.

The organic EL display device has the following characteristics. (1) The organic EL display device does not need backlights since it is of a spontaneous light type as compared to a liquid crystal display device; (2) in the organic EL display device, voltage required for light emission is low, namely, 10 V or less, and there is a chance of being able to reduce power consumption; (3) as compared to the plasma display device and an FED display device, the organic EL display device does not need a vacuum structure and is suitable for weight-lightening and thickness reduction; (4) the response time of the organic EL display device is short, namely, several microseconds, and the animation characteristic of the organic EL display device is excellent; (5) the visual field angle of the organic EL display device is wide, namely, 170 degrees or more; and the like.

However, if moisture and/or oxygen is present around an organic EL material, the oxidation of the material speeds up, dark spots are generated, and the luminescence characteristic is deteriorated. In order to address this problem, after a wiring, a switching element, an organic EL layer and the like are provided on a substrate, a glass substrate or a sealing can for sealing is mounted to a back face of the substrate, to thereby hermetically seal an interior of a display device, and a desiccant member is disposed within the interior of the display device, whereby moisture is eliminated from the interior of the display device within which the organic EL material is provided.

Referring now to FIGS. 14 and 15, conventional display devices will be discussed hereinafter in order to facilitate understanding of the present invention. FIG. 14 is a schematic sectional view of a conventional example in which sealing of the display device is performed utilizing a sealing can 7. Though an undercoat layer, a wiring, a switching element, and the like are provided on a substrate 1, they are have been left out of the illustration. An organic EL film 3 emits light by applying voltage between a lower electrode 2 and an upper electrode 4. The sealing can 7 is mounted to the substrate by a sealing member 8, whereby an interior of the display device is kept hermetically sealed. In order to eliminate moisture from the interior, a desiccant member 5 is mounted inside the sealing can 7. The desiccant member 5 is fixed inside the sealing can 7 by a double-sided adhesive tape 6. As a material for the sealing can 7, metal such as stainless steel and the like is employed. As a material for the desiccant member 5, active carbon, zeolite, silica gel, or the like is employed. Moreover, in order to improve a color balance of emitted light colors, a polarizing plate 11 is stuck onto an outer surface of the substrate.

FIG. 15 is a schematic sectional view of another example of the conventional display device, in which the interior of the display device is kept hermetically sealed by a rear glass plate 9. The rear glass plate 9 is mounted through a sealing frame 10 to a substrate 1 by sealing members 8 in order that a space between the rear glass plate 9 and the substrate 1 is kept, whereby the interior of the display device is kept airtight. In this case, a desiccant member 5 is fixed on an inner surface of the rear glass plate 9 by a double-sided adhesive tape 6. As a material for the desiccant member 5 of FIG. 15, the same material as the material is employed for the desiccant member mounted to the sealing can 7 of FIG. 14 is employed. In order to improve a color balance of emitted light colors, bonding of a polarizing plate 11 onto an outer surface of the substrate 1 is carried out in the same manner as the polarizing plate is bonded onto the outer surface of the substrate 1 in the example of FIG. 14.

The above-mentioned conventional examples are disclosed in Japanese Patent Application Laid-Open Publication Nos. H3-261091 and 2001-345175, for example.

In the organic EL display devices shown in FIGS. 14 and 15, the polarizing plate is bonded to the substrate in order to improve the color balance of the emitted light colors. At the time of the bonding of the polarizing plate, such force as to be indicated by a designator F in FIGS. 14 and 15 is applied to the sealing can or the rear glass plate from the back due to repulsive force. Moreover, when air bubbles are generated between the substrate and the polarizing plate bonded onto the substrate, the display device is placed in a pressure vessel in order to eliminate the air bubbles, that is, the display device is subjected to the so-called autoclave processing. At this time, the same force is also applied to the rear glass plate or the sealing can.

When such force is applied to the sealing can or the rear glass plate, they are made to flex inward. When they are made to flex inward, if a gap g (shown in FIGS. 14 and 15) between the desiccant member and the upper electrode or the organic EL layer is small, the desiccant member and the upper electrode or the organic EL layer make contact with each other, whereby the organic EL layer is broken. A thickness of the upper electrode is 150 nm, while a thickness of the desiccant member is about 0.15 mm. Moreover, the organic EL layer has, for example, a five-lamination-layer structure, but the total thickness of five layers is just about 130 nm. Thus, when the desiccant member and the upper electrode or the organic EL layer make contact with each other, the organic EL layer is easily destroyed.

Moreover, if a screen of the display device is made large-sized, an amount of the above-mentioned deflection of the sealing can or the rear glass plate becomes larger, so that the foregoing problem becomes more serious. One of the characteristics of the organic EL display device is to be able to make the thickness of the entire display device thin. However, if the gap g shown in FIGS. 14 and 15 is made large in order that the contact between the desiccant member and the upper electrode or the organic EL layer can be avoided, the advantage of the organic EL display device is lost. On the other hand, even if the thickness of the sealing can or the rear glass plate is made large in order that the deflection of the sealing can or the rear glass plate is made reduced, the display device not only becomes thick as a whole but also becomes heavy.

SUMMARY OF THE INVENTION

It is therefore an object of the present invention to address the foregoing problems and to provide an organic EL display device which is concretely constructed as discussed hereinafter.

In accordance with one aspect of the present invention, there is provided (1) an organic EL display device which includes a substrate having a screen provided thereat, organic EL layers arranged in matrix form on a surface of the substrate and adapted to emit light when voltage is applied to the organic EL layers, the organic EL display device being adapted to produce an image on the screen when voltage is applied to the organic EL layers and the organic EL layers then emit the light, a sealing can mounted to the surface of the substrate by sealing members, whereby an interior of the organic EL display device is hermetically sealed, the sealing can having side portions and a bottom portion, rib means protruding from an inner surface of the bottom portion of the sealing can and provided so as to traverse the screen when the display device is superficially viewed, and desiccant means installed on an area of the inner surface of the bottom portion on which the rib means is not provided.

(2) The substrate may be a glass substrate.

(3) The sealing can may be formed of metal.

(4) The rib means may include a rib substantially parallel to a minor axis of the substrate.

(5) The rib means may include a rib substantially parallel to a major axis of the substrate.

(6) The rib means may include first ribs substantially parallel to a minor axis of the substrate, and second ribs substantially parallel to a major axis of the substrate.

(7) The desiccant means may be bonded to the bottom portion of the sealing can by double-side adhesive means, the rib means has a height measured in such a direction as to be directed toward the substrate, and the desiccant means has a height measured in the direction, the height of the rib means being larger than that of the desiccant means.

(8) The sealing can may have corner ribs provided at the side portions thereof.

(9) A height of the rib means may be equivalent to that of the sealing can.

According to a second aspect of the present invention, there is provided (10) an organic EL display device which includes a substrate having a screen provided thereat, organic EL layers arranged in matrix form on a surface of the substrate and adapted to emit light when voltage is applied to the organic EL layers, the organic EL display device being adapted to produce an image on the screen when voltage is applied to the organic EL layers and the organic EL layers then emit the light, a rear glass plate sealingly bonded to the surface of the substrate by a sealing member, whereby an interior of the organic EL display device is hermetically sealed, the rear glass plate having a plurality of spaced apart recess portions, and thick portions between respective adjacent recess portions, the thick portions between the respective adjacent recess portions being provided so as to traverse the screen when the display device is superficially viewed, and desiccant means installed in each of the recess portions.

(11) The recess portions may be formed by sand blasting.

(12) The thick portions between the respective adjacent recess portions of the rear glass plate may be substantially parallel to a minor axis of the display device.

(13) The thick portions between the respective adjacent recess portions of the rear glass plate may be substantially parallel to a major axis of the display device.

(14) The thick portions between the respective adjacent recess portions of the rear glass plate may comprise regions substantially parallel to a major axis of the display device, and regions substantially parallel to a minor axis of the display device.

(15) A distance between the substrate and the thick portions between the respective adjacent recess portions of the rear glass plate may be smaller than a distance between the desiccant means and the substrate.

(16) A thickness of the rear glass plate and a thickness of each of the thick portions between the respective adjacent recess portions may be same.

In accordance with a third aspect of the present invention, there is provided (17) an organic EL display device which includes a substrate having a screen provided thereat, organic EL layers arranged in matrix form on a surface of the substrate and adapted to emit light when voltage is applied to the organic EL layers, the organic EL display device being adapted to produce an image on the screen when voltage is applied to the organic EL layers and the organic EL layers then emit the light, a rear glass plate sealingly bonded through a sealing frame to the surface of the substrate by sealing members, whereby an interior of the organic EL display device is hermetically sealed, elongated plate means bonded on an inner surface of the rear glass plate so as to traverse the screen when the display device is superficially viewed, and desiccant means installed on an area of the inner surface of the rear glass plate on which the elongated plate means is not provided.

(18) The elongated plate means may include glass plate means.

(19) The elongate plate means may be provided so as to be substantially parallel to a minor axis of the display device.

(20) The elongated plate means may be formed so as to be substantially parallel to a major axis of the display device.

(21) The elongated plate means may include elongated plates substantially parallel to a minor axis of the display device, and elongated plates substantially parallel to a major axis of the display device.

(22) A distance between the elongated plate means and the substrate may be smaller than a distance between the desiccant means and the substrate.

Effects which are provided by the display devices constructed as described above are as follows.

According to the above constructions (1) to (9), the rib parallel to the minor axis of the substrate or the rib parallel to the major axis of the substrate are formed on the bottom portion of the sealing can, so that section modulus of the bottom portion of the sealing can becomes large, and an amount of deflection of the sealing can is reduced with respect to external force, thus making it possible to prevent breakage of the organic EL layer which is brought about by contact between the organic EL layer and the desiccant means provided on the inner surface of the bottom portion of the sealing can.

According to the above constructions (10) to (16), the rear glass plate having the recess portions formed therein is employed in order to seal the interior of the display device, the desiccant means is installed in each of the recess portions, the thick portions of the rear glass plate in which the recess portions are not formed serve as the ribs and are formed so as to traverse the display screen of the display device, so that an amount of deflection of the rear glass plate is reduced with respect to external force, thus making it possible to prevent breakage of the organic EL layer which is brought about by contact between the organic EL layer and the desiccant means provided on the inner surface of the bottom portion of the rear glass plate. Moreover, the portions except the rib portions of the rear glass plate are made thin, so that the weight of the entire display device can be reduced.

According to the above constructions (17) to (22), the interior of the organic EL display device is sealed by causing the rear glass plate through the sealing frame to the substrate by the sealing members. Therefore, desired sealing of the display device can be performed merely by assembling relatively simple components, without causing the rear glass plate to be subjected to a processing such as sand blasting. Moreover, the elongated glass plates serving as the ribs are bonded to the inner surface of the rear glass plate, thus making it possible to reduce an amount of deflection of the rear glass plate with respect to any external force. Therefore, it is possible to prevent breakage of the organic EL layer which is brought about due to contact between the organic EL layer and the desiccant means installed on the inner surface of the rear glass plate.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE INVENTION

Preferred embodiments of an organic EL display device according to the present invention will be discussed hereinafter in conjunction with the drawings.

First Embodiment

Figure 1:
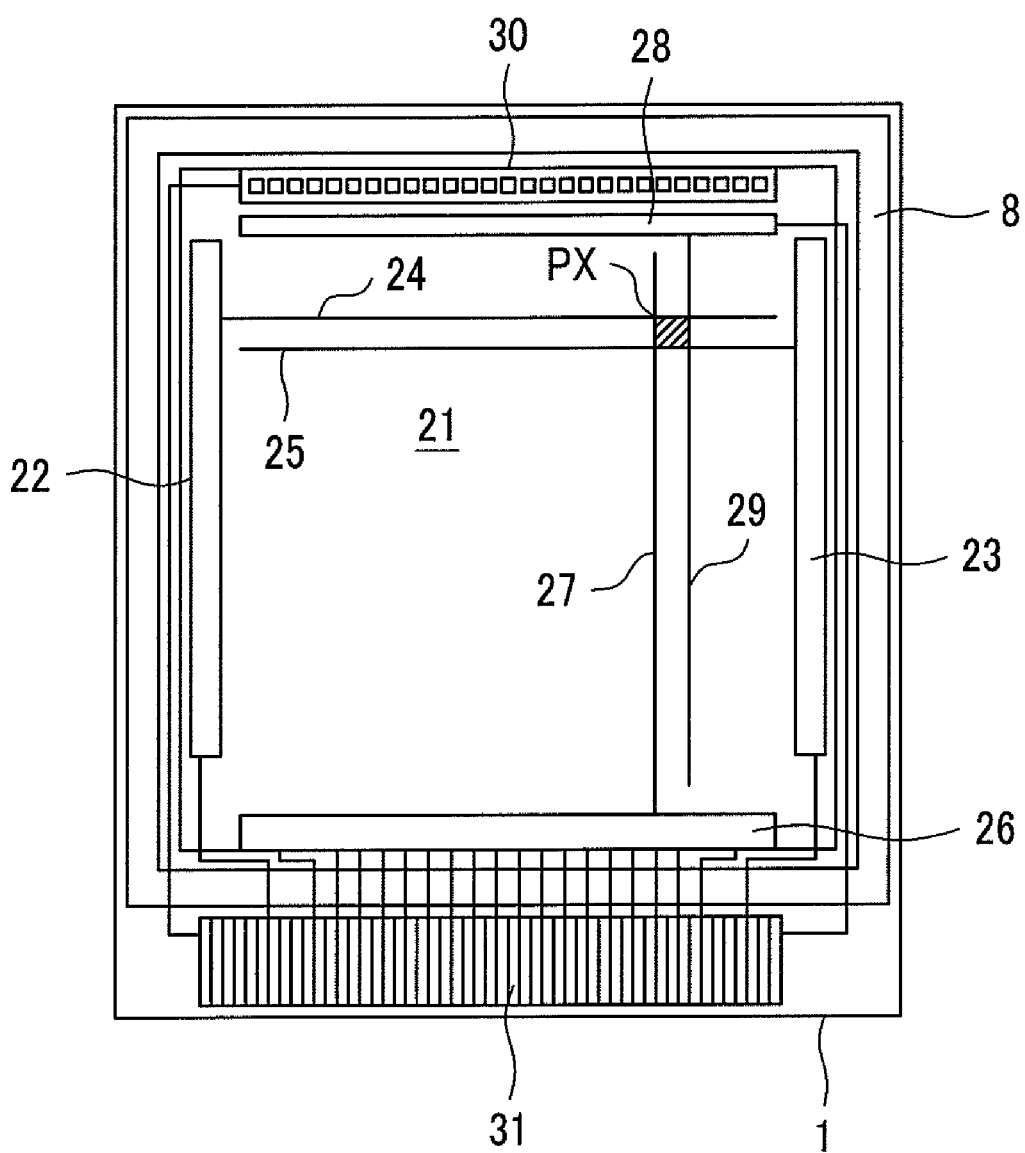
FIG. 1 is a schematic plan view of a substrate according to the present invention.

FIG. 1 is a schematic plan view of a substrate 1 in a condition where a sealing can 7 is not yet mounted to the substrate 1. The substrate 1 has a display region 21 formed at a large part of a center thereof. Scan signal drive circuits 22, 23 are disposed on both sides of the display region. Gate signal wires are extended from the scan signal drive circuits 22, 23. The gate signal wires 24 (only one gate signal wire 24 is shown in FIG. 1) extending from the left scan signal drive circuit 22 and the gate signal wires 25 (only one gate signal wire 25 is shown in FIG. 1) extending from the right scan signal drive circuit 23 are alternately disposed.

An image signal drive circuit 26 is disposed below the display region 21. Data signal wires 27 (only one data signal wire 27 is shown in FIG. 1) are extended along the display region 21 from the image signal drive circuit 26. A current supply bus 28 is disposed above the display region 21. Current supply wires 29 (only one current supply wire 29 is shown in FIG. 1) are extended along the display region 21 from the current supply bus 28.

The data signal wires 27 and the current supply wires 29 are alternately disposed, whereby a pixel region PX is formed in each of areas surrounded by the data signal lines 27, the current supply wires 29, and the gate signal wires 24, 25.

Figure 2:
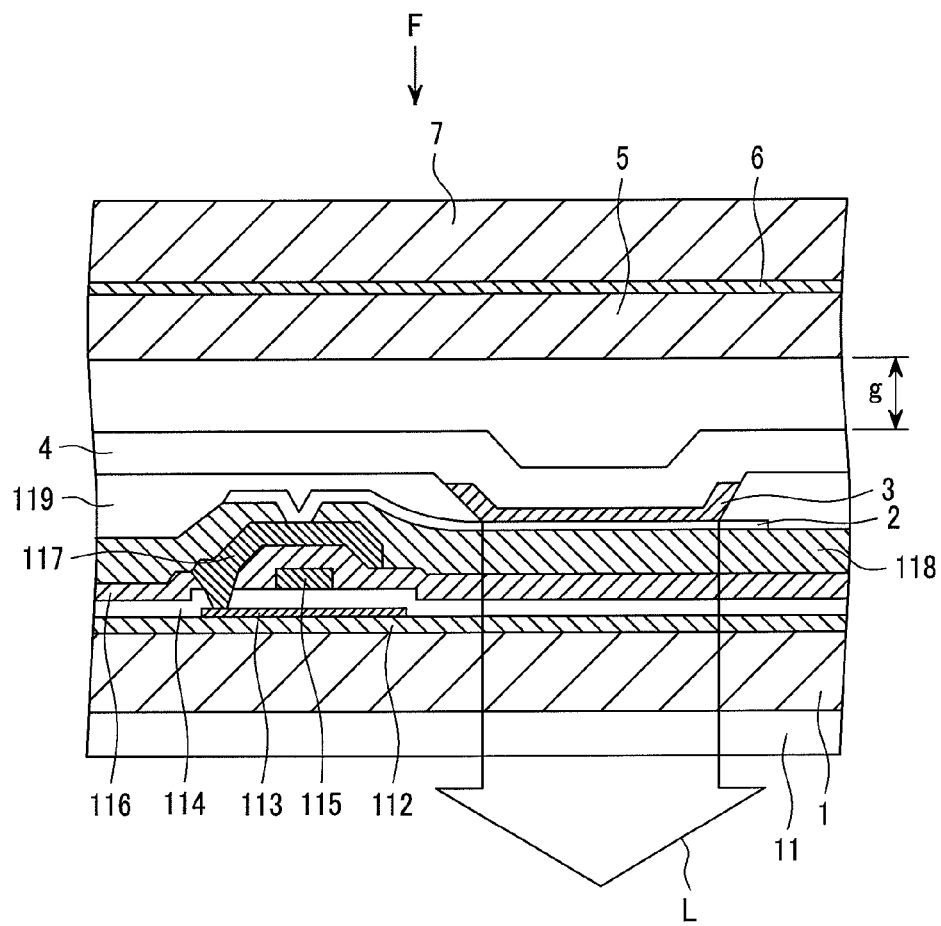
FIG. 2 is a schematic enlarged sectional view of a pixel section according to the present invention.

Above the display area, a group of contact holes 30 are formed. The group of contact holes 30 serve as means to electrically connect an upper electrode 4 of each of organic EL films 3 (only one organic EL film 3 is shown in FIG. 2) formed in matrix form over the entire display region to a wiring extending to a terminal which is formed under an insulating film. Below the display region, there are formed terminals 31 from which a scan signal, a data signal, and an anode potential and a cathode potential with respect to the organic EL film 3 are supplied.

A sealing member 8 is provided on the substrate 1 so as to surround the display region 21, the scan signal drive circuits 22, 23, the image signal drive circuit 26, and the current supply bus 28. The sealing can 7 is sealingly bonded to the sealing member 8. The terminals 31 are provided on a portion of the substrate 1 which is outside the sealing member 8, and are adapted to supply signals or current to the scan signal drive circuits 22, 23, the image signal drive circuit 26, the current supply bus 28, and the like.

FIG. 2 is a schematic enlarged sectional view of the pixel region PX shown in FIG. 1, and a desiccant member 5 and the sealing can 7 which are arranged above the pixel region. More particularly, FIG. 2 is a schematic enlarged sectional view of a pixel section of a display device employing a thin film transistor (TFT) as a switching element and driving the organic EL film. In the example shown in FIG. 2, an undercoat layer 112 is applied onto the glass substrate 1. This undercoat layer 112 serves as means to prevent impurities from the glass substrate 1 from contaminating the TFT and the organic EL film 3. At a semiconductor portion 113, a source part, a channel part, and a drain part are formed. A gate insulating film 114 are formed so as to cover the semiconductor portion 113. On the gate insulating film 114, a gate electrode 115 is formed. An interlayer insulation film 116 is formed so as to cover the gate electrode 115. On the interlayer insulation film 116, an SD wiring 117 is formed. The SD wiring 117 is connected to the source part or the drain part of the semiconductor portion 113 through a through-hole formed in the interlayer insulation film 116, and acts as means to take out a signal from the TFT. A passivation film 118 for protecting the entire TFT is formed so as to cover the SD wiring 116. A transparent electrode ITO acting as a lower electrode 2 of the organic EL film 3 is formed on the passivation film. The transparent electrode 2 is connected to the SD wiring through a through-hole formed in the passivation film. Moreover, on the transparent electrode 2 and the passivation film 118, banks 119 for separating respective pixels are formed. On each of portions of the transparent electrode and the passivation film 118 on which the banks 119 are not formed, the organic EL films 3 acting as a light emitting sections is deposited. Moreover, on the organic EL film 3, a metallic film acting as the upper electrode 4 is formed. The organic EL film 3 generally includes a multiple-layer structure and is adapted to emit light by applying voltage between the upper electrode 4 acting as a cathode and the lower electrode 2 acting as an anode. The lower electrode 2 is formed as a transparent electrode. Since the passivation film 118, the interlayer insulation film 116 and the undercoat layer 112 are all transparent, light emitted from the organic EL film 3 travels toward such a direction as to be indicated by an arrow L in FIG. 2 (bottom emission). On the other hand, light directed toward the metal-made upper electrode 4 is reflected by the upper electrode 4 and then also travels toward the direction indicated by the arrow L in FIG. 2. A desiccant member 5 is arranged above the upper electrode 4 so as to be spaced apart from the upper electrode 4 by a gap g. The desiccant member 5 is fixed to the sealing can 7 through a double-sided adhesive tape 6. This gap g is 0.1 mm-0.2 mm.

Figure 3:
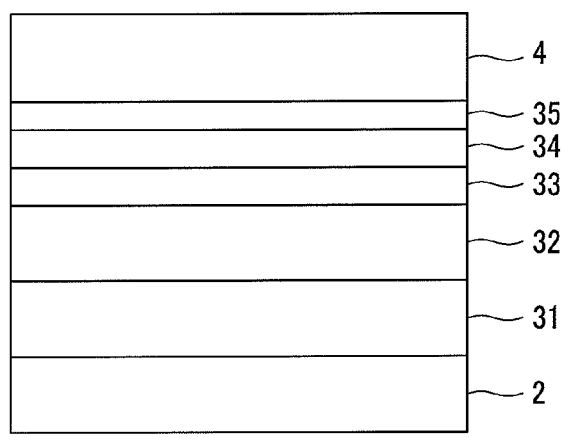
FIG. 3 is a schematic enlarged sectional view of an organic EL film.

FIG. 3 is a schematic enlarged sectional view of an example of the organic El film 3 acting as the light-emitting section. In the example illustrated in FIG. 3, over the lower electrode 2 being the transparent electrode, a hole injection layer 31 having a thickness of 50 nm, a hole transportation layer 32 having a thickness of 40 nm, a light-emitting layer 33 having a thickness of 20 nm, an electron transportation layer 34 having a thickness of 20 nm, and an electron injection layer 35 having a thickness of 0.5 nm, are in turn formed. The upper electrode 4 has an aluminum spatter layer of about 150 nm in thickness formed thereon. The total thickness of the organic EL film 3 having all of the layers is only 130 nm or so, so that, when the desiccant member 5 and the like come into contact with the organic EL film 3, the organic EL film 3 is easily broken.

The desiccant member 5 is bonded to an inner side of the sealing can 7 or the like by the double-sided adhesive tape 6 or the like. The sealing can 7 and the substrate 1 are then sealingly bonded to each other through the sealing member 8 in an atmosphere of dried nitrogen. An interior of the display device becomes filled with the dried nitrogen. The organic EL film is not heat-resistant, so that if a sealing member formed of thermosetting material is employed as the sealing member 8, it is necessary to use it which is adapted to harden at a temperature of 80° C. or less. In this embodiment, an epoxy resin which is hardened by ultraviolet rays is used as the material for the sealing member 8, because the epoxy resin is excellent in resistance to moisture permeability. The organic EL film 3 is easily affected by ultraviolet rays, so that special attention should be given to irradiation of ultraviolet rays in such a manner that the ultraviolet rays are not applied to the organic EL film 3 and are applied to only regions to be sealed.

After the interior of the display device is sealed by the sealing can 7, a polarizing plate 11 is bonded onto an outer surface of the substrate 1. The job of the polarizing plate 11 is to emphasize a specified color of emitted light, to thereby improve a color balance of emitted light colors. Generally, a circularly polarizing plate which emphasizes a blue color is employed. When the bonding of the polarizing plate 11 is carried out, a repulsive force is generated and force produced by the repulsive force is then applied to the sealing can 7 in such a direction as to be indicated by an arrow F in FIG. 2. Generally, the strength of the sealing can 7 is lower that that of the substrate 1, so that the sealing can 7 will be made to flex. Therefore, if the gap g between the upper electrode 4 of the organic EL film and the desiccant member 5 is small, the desiccant member 5 and the upper electrode 4 of the organic EL film make contact with each other, whereby the organic EL film 3 is broken. On the other hand, if the gap g between the upper electrode 4 of the organic EL film and the desiccant member 5 is taken so as to be sufficiently large, the thickness of the entire display device becomes large, resulting in the advantage of a flat display device being lost.

Figure 4A:
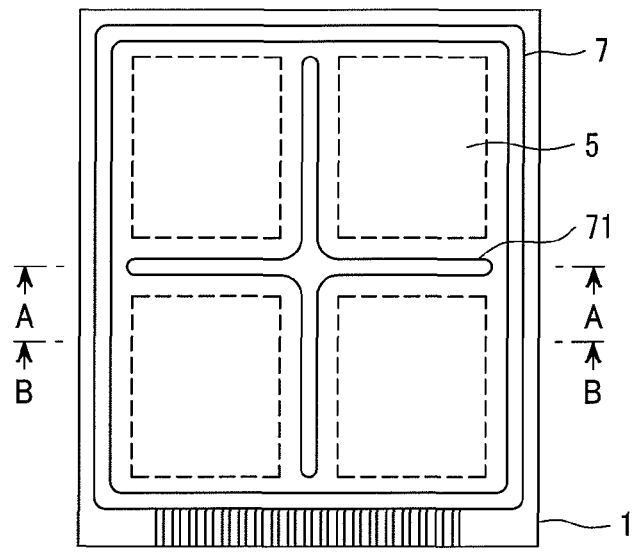
FIG. 4A is a schematic rear view of a display device according to a first embodiment of the present invention.
Figure 4B:
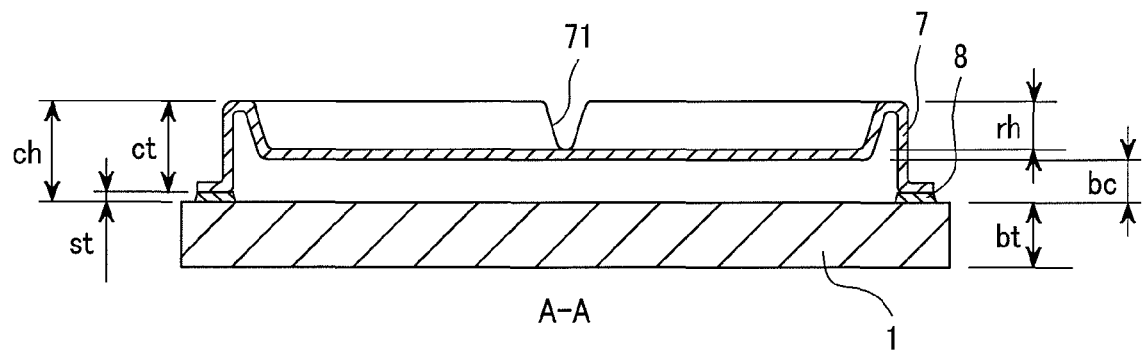
FIG. 4B is a schematic enlarged sectional view of the first embodiment, taken along a line A-A in FIG. 4A.
Figure 4C:
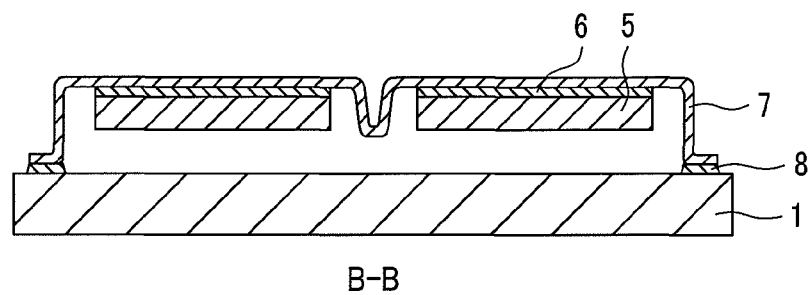
FIG. 4C is a schematic enlarged sectional view of the first embodiment, taken along a line B-B in FIG. 4A.

FIG. 4A is a schematic plan view of a first embodiment of the present invention, as viewed from the side of the sealing can 7. FIG. 4B is a schematic enlarged sectional view of the embodiment, taken along a line A-A in FIG. 4A. FIG. 4C is a schematic enlarged sectional view of the embodiment, taken along a line B-B in FIG. 4A. The sealing can 7 has a cross-shaped rib 71 formed at a center part of an inner surface of a bottom portion thereof. By this rib 71, the section modulus of the bottom portion of the sealing can 7 is considerably raised and the deflection of the bottom portion of the sealing can 7 becomes small. In this embodiment, four desiccant members 5 are mounted on the inner surface of the bottom portion of the sealing can 7 by double-sided adhesive tapes 6. It is economically advantageous to install a plurality of standardized desiccant members 5 on the inner surface the bottom portion of the sealing can 7 rather than install a large-sized desiccant member on the inner surface of the bottom portion of the sealing can 7.

The higher a height rh of the rib 71 formed on the bottom portion of the sealing can 7 is, the larger the section modulus of the bottom portion of the sealing can 7 will become and the lesser the deflection of the bottom portion of the sealing can 7 will become. Therefore, the height rh of the rib 71 is made large so as to be equivalent to or more than the total thickness of the desiccant member 5 and the double-sided adhesive tape 6. As a material for the sealing can 7, there may be employed, for example, a stainless steel plate having a thickness of 0.2 mm or so. According to the composition of stainless steel, the stainless steel which has a thermal expansion coefficient close to that of glass may be selected. The material for the sealing can 7 is not limited to stainless steel and may be any suitable metal other than stainless steel. Any metal which has a thermal expansion coefficient close to that of the substrate 1 is particularly suitable. On the other hand, if only requests for the thermal expansion coefficient and strength of the sealing can 7 are satisfied, plastic material may be employed as the material for the sealing can 7. In the illustrated example, a thickness of the desiccant member 5 is 0.15 mm and a thickness of the double-sided adhesive tape 6 is 0.05 mm, so that the height of the rib 71 can be raised so as to be at least up to 0.2 mm and the deflection amount of the bottom portion of the sealing can 7 can be considerably reduced.

Referring to FIG. 4B, an example of the dimension configuration of a cross-section structure of the organic EL display device according to this embodiment will be discussed hereinafter. In the illustrated example, a thickness bt of the substrate 1 is 0.7 mm, a height ct of the sealing can 7 is also 0.7 mm. A thickness of the sealing member 8 is 0.03 mm, so that a height measured between the substrate 1 and an upper surface of the sealing can 7 amounts to 0.73 mm. A plate thickness of the sealing can 7 is 0.2 mm, so that, if the height of the rib 71 is made to be 0.2 mm, a distance bc between the substrate 1 and the rib 71 amounts to 0.33. If improvement in the strength of the sealing can 7 which is provided by the rib 71 is taken into account, this distance is an enough distance. Thicknesses of the layers including the TFT and the like are small relative to the dimension of the above-mentioned mechanical structure, so that if the thicknesses of the layers are ignored, the gap g shown in FIG. 2 and the distance bc between the substrate 1 and the rib 71 which is shown in FIG. 4B are equivalent to each other. There is a trade-off relationship between the height rh of the rib 71 and the distance bc between the substrate 1 and the rib 71. That is, the height of the rib 71 may be made large and the distance bc between the substrate 1 and the rib 71 may be made small. If the height of the rib 71 is raised, the advantage of being able to make the thickness of the desiccant member 5 large can be obtained.

As an effect provided by this embodiment, it is possible to make the plate-thickness of the sealing can 7 small by forming the rib 71, so that there is obtained the advantage of being cable to make the weight of the entire display device small.

Second Embodiment

Figure 5A:
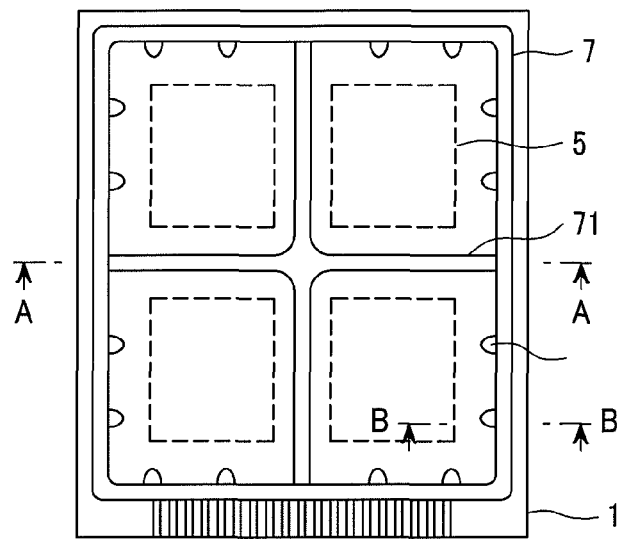
FIG. 5A is a schematic rear view of a display device according to a second embodiment of the present invention.
Figure 5B:
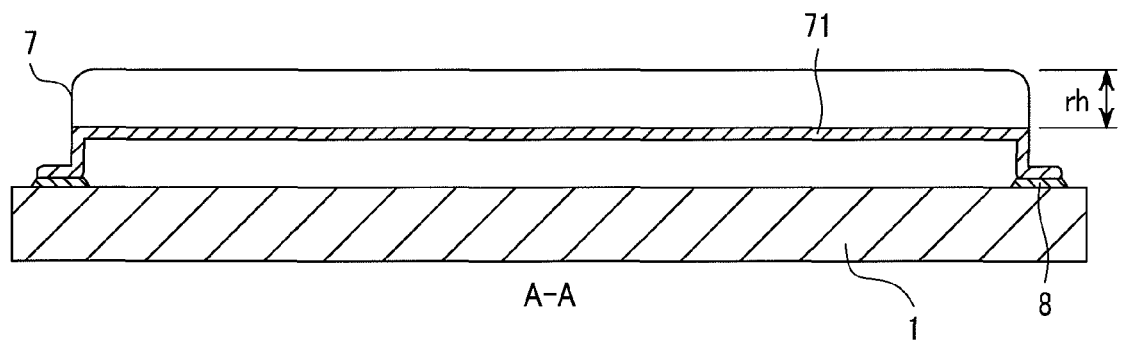
FIG. 5B is a schematic enlarged sectional view of the second embodiment, taken along a line A-A in FIG. 5A.
Figure 5C:
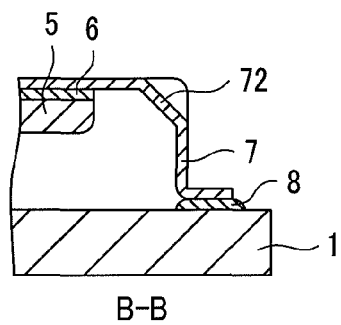
FIG. 5C is a schematic enlarged sectional view of the second embodiment, taken along a line B-B in FIG. 5A.

FIGS. 5A, 5B and 5C illustrate a second embodiment according to the present invention. The second embodiment is similar to the first embodiment except that a configuration of the rib 71 formed on the bottom portion of the sealing can 7 is different from that of the rib 71 of the first embodiment.

FIG. 5A is a schematic plan view of the display device according to the second embodiment of the present invention, as viewed from the side of the sealing can 7. The second embodiment differs from the first embodiment in that the cross-shaped rib 71 is formed in such a manner that ends of the cross-shaped rib 71 lead to side portions of the bottom portion of the sealing can 7. When force is applied to the bottom portion of the sealing can 7, regions of the sealing can 7 to which stress is mostly applied are regions adjacent the side portions of the bottom portion of the sealing can 7. Therefore, the rib 71 is formed in such a manner that the ends of the rib 71 lead to the region adjacent the side portions of the bottom portion of the sealing can 7, whereby the section moduli of the side portions are made large, thus making it possible to make the deflection amount of the sealing can 7 lesser than that of the sealing can 7 of the first embodiment.

FIG. 5B is a schematic enlarged sectional view of the second embodiment, taken along a line A-A in FIG. 5A. In the second embodiment, the higher a height rh of the rib 71 is, the larger the section modulus of the bottom portion of the sealing can 7 also becomes and the lesser the deflection of the bottom portion of the sealing can 7 also becomes. Like the first embodiment, the height rh of the rib 71 can be made high so as to be equivalent to or more than the total thickness of the desiccant member 5 and the double-sided adhesive tape 6.

FIG. 5C is a schematic enlarged sectional view of the second embodiment, taken along a line B-B in FIG. 5A. In the second embodiment, in addition to the cross-shaped rib 71, corner ribs 72 are provided at the side portions of the bottom portion of the sealing can 7 so as not to prevent the arrangement of the desiccant members 5. By this, it is possible to cause the section moduli of the entire side portions of the bottom portion of the sealing can 7 as well as the section modulus of the center part of the bottom portion of the sealing can 7 to be increased and it is possible to cause the deflection amount of the bottom portion of the sealing can 7 to be reduced.

Effects provided by the second embodiment include the effect provided by the first embodiment, and the advantage of being capable of preventing the deformation of the sealing can 7 which is brought about by any external shock and the like, since the corner ribs 72 are provided at the side portions of the bottom portion of the sealing can 7, even if a plate material having a small plate-thickness is employed for the sealing can 7.

Third Embodiment

Figure 6:
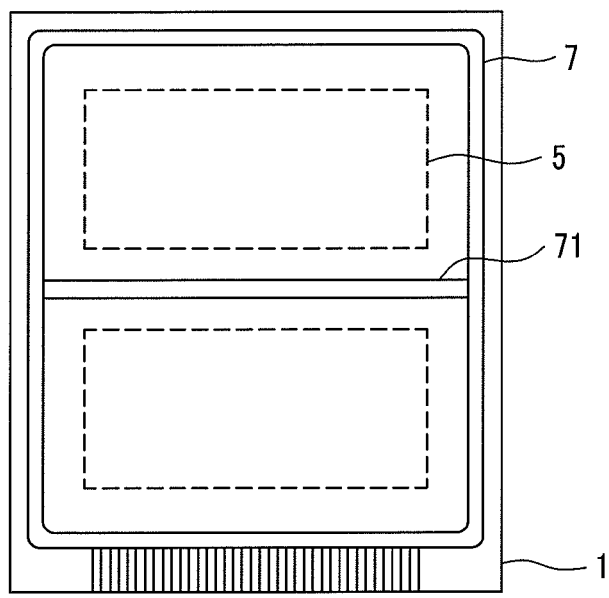
FIG. 6 is a schematic rear view of a display device according to a third embodiment of the present invention.
Figure 7:
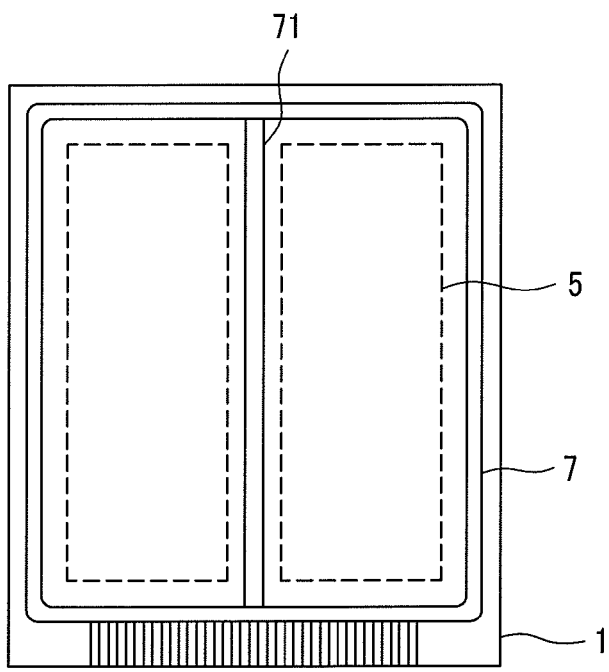
FIG. 7 is a schematic rear view of a modification of the third embodiment.

The main object of the present invention is to prevent the breakage of the organic EL film 3 by improving the space factor of the bottom portion of the sealing can 7 by providing the rib 71 as well as the desiccant members 5 on the bottom portion of the sealing can 7, to thereby add the strength of the sealing can 7, and reduce the deflection amount of the sealing can 7. There are different variations in a process for forming the rib 71 and a process for arranging the desiccant members 5, according to the size and the like of the display device. FIGS. 6 and 7 is each a schematic plan view of a relatively small-sized display device. In each of the illustrated examples, the rib 71 provided on the bottom portion of the sealing can 7 is not cross-shaped and is formed so as to linearly traverse the center part of the bottom portion of the sealing can 7. A cross-section of the rib 71 of the embodiment has the same shape as that of the rib of the second embodiment does. If the standardized desiccant members 5 are employed, the cost of the desiccant members can be reduced, so that the disposition location of the rib 71 may be fixed according to the shapes of the desiccant members 5. Conversely, from the request for reducing the deflection amount of the sealing can 7, the height rh of the rib 71 is fixed and the shapes of the desiccant members 5 may be fixed so as to suit the fixed height rh of the rib 71. In this embodiment, as required, corner ribs may be provided in the same manner as in the second embodiment.

Figure 8:
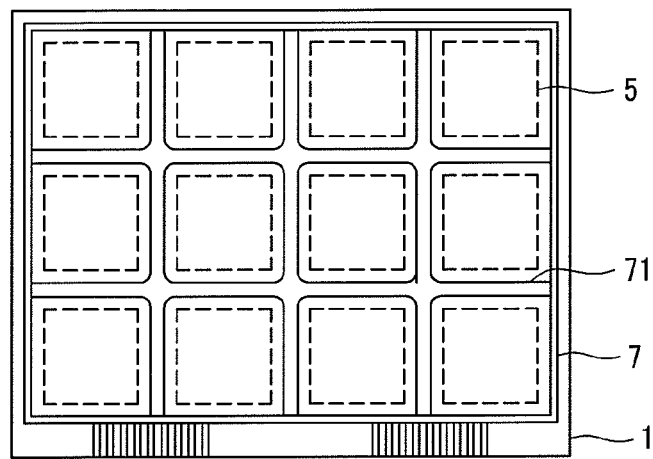
FIG. 8 is a schematic rear view of another modification of the third embodiment.

FIG. 8 is a schematic plan view of a large-sized display device, as viewed from the side of the sealing can 7. In the example illustrated in FIG. 8, the number of the ribs 71 is increased according to the size of the display device. Though illustration of a cross-sectional shape of the rib 71 is omitted, the rib 71 of this embodiment basically has the same cross-sectional shape as the rib 71 of the second embodiment does. The number of the ribs 71 may be fixed from requests for an allowable deflection amount of the sealing can and external shapes of the desiccant members 5. It is possible to reduce the cost of the desiccant member 5 by employing a plurality of standardized desiccant members 5 to be used in the small-sized display device rather than specially producing a large-sized desiccant member. Moreover, by this, there is provided the advantage of being capable of increasing the number of the ribs 71. In the example illustrated in FIG. 8, as required, corner ribs may be also provided at the side portions of the bottom portion of the sealing can 7.

Fourth Embodiment

Figure 9A:
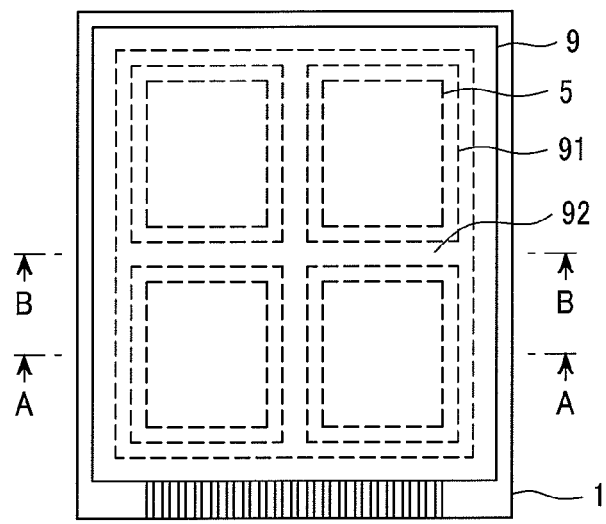
FIG. 9A is a schematic rear view of a display device according to a fourth embodiment of the present invention.
Figure 9B:
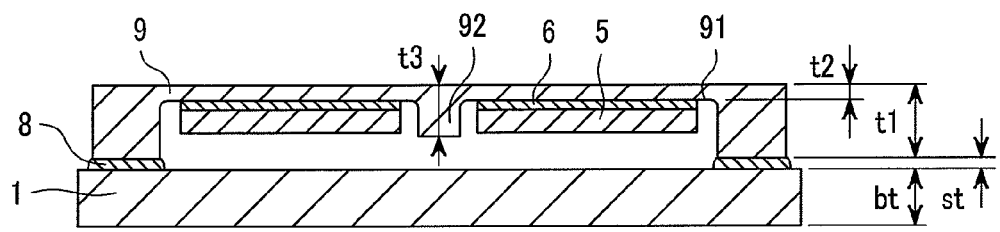
FIG. 9B is a schematic enlarged sectional view of the fourth embodiment, taken along a line A-A in FIG. 9A.
Figure 9C:
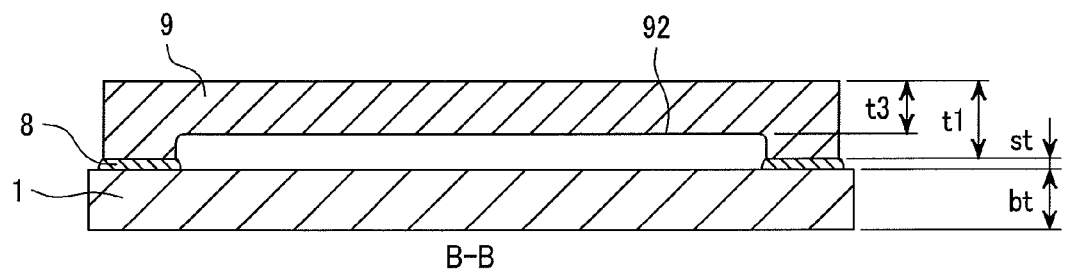
FIG. 9C is a schematic enlarged sectional view of the fourth embodiment, taken along a line B-B in FIG. 9A.

FIGS. 9A, 9B and 9C illustrate a fourth embodiment according to the present invention. In the fourth embodiment, for moisture-proofness of the display device, a rear glass plate 9 is employed in lieu of the sealing can 7. The rear glass plate 9 is formed from a piece of glass, which is subjected to sand blasting or the like, whereby recess portions serving as spaces in which the desiccant members are to be disposed are formed in the glass piece.

FIG. 9A is a schematic plan view of the display device according to the fourth embodiment. In the illustrated example, the rear glass plate 9 has four installation spaces or recess portions 91 for the desiccant members 5, which are formed by the sand blasting. The rear glass plate 9 has a thick part 92 formed at a center part thereof so as to be cross-shaped. This part 92 serves as a rib.

FIG. 9B is a schematic enlarged sectional view of the fourth embodiment, taken along a line A-A in FIG. 9A, in which a condition where the desiccant members 5 are bonded to the recess portions 91 by the double-sided adhesive tapes 6. In the example illustrated in the FIG. 9B, a thickness bt of the substrate 1 is 0.7 mm, and a thickness t1 of the rear glass plate 9 is 0.7 mm. A thickness st of the sealing member 8 is 0.03 mm, so that a distance measured between the substrate and an upper surface of the rear glass plate is 0.73 mm. A depth of each of the recess portions 91 formed in the glass plate is 0.3 mm. The recess portions 91 are formed by causing specific portions of the glass piece to be shaved by the sand blasting. The glass piece is subjected to the sand blasting in a condition where portions except the portions of the glass piece which are to be shaved are masked. An amount of glass to be shaved from the glass piece by the sand blasting is 0.25 mm. On a surface of the glass piece shaved by the sand blasting, many microcracks are produced, resulting in a detrimental effect being exerted on the strength of the glass plate. Therefore, the remaining parts of the glass piece are removed by about 0.05 mm by an etching process. When the glass piece is subjected to the etching process, the same mask as used in the sand blasting can be utilized.

Then, the desiccant members 5 are bonded to the formed recess portions 91 of the rear glass plate by the double-sided adhesive tapes 6. In the illustrated example, a thickness of the desiccant member 5 is 0.15 mm and a thickness of the double-sided adhesive tape 6 is 0.05 mm. A thickness of a part between adjacent recess portions 91, namely, a thickness t3 of a part serving as the rib 92 is smaller than the plate-thickness t1 of the rear glass plate as shown in FIGS. 9B and 9C. In order to cause the thickness t3 to be smaller than the thickness t1, for example, if the part 92 which is to serve as the rib is not subjected to the sand blasting and is subjected to the etching only, it is possible to cause the thickness t3 only to be smaller by about 0.05 mm than the thickness t1.

However, such a step as discussed above may be omitted and the thickness t1 and the thickness t3 may be the same. Even in this case, a gap of 0.03 mm which is equivalent to the thickness of the sealing member 8 is provided at a center part of the display device. However, in the case where there is the gap of 0.03 mm only, there is a possibility that the rear glass plate 9 and the organic EL film 3 will make contact with each other due to the deflection of the rear glass plate. In this case, when filling of nitrogen gas is carried out and the rear glass plate is then sealingly bonded to the substrate by the sealing member 8, pressure inside the display device is made positive and the center part of the display device rather than a peripheral part of the display device is then expanded, thus making it possible to provide an enough space between the substrate 1 and the rib part 92 of the rear glass plate 9.

As shown in FIG. 9B, the desiccant members 5 are bonded onto the rear glass plate 9 by the double-sided adhesive tapes 6. In this embodiment, as described above, the thickness of the desiccant member 5 is 0.15 mm and the thickness of the double-sided adhesive tape 6 is 0.05 mm. Therefore, the depth of the recess portion 91 formed in the rear glass plate is larger by about 0.1 mm than the total thickness of the desiccant member 5 and the double-sided adhesive tape 6. In this case, the total thickness of the desiccant member 5 and the double-sided adhesive tape 6 can be made large up to 0.3 mm. That is, it is preferable that the height of the rib part 92 formed on the rear glass plate is equivalent to or larger than the total thickness of the desiccant member 5 and the double-sided adhesive tape 6.

FIG. 9C is a schematic enlarged sectional view of the fourth embodiment, taken along a line B-B in FIG. 9A. This Figure is a schematic enlarged sectional view illustrating a thick part of the rear glass plate, namely, a part of the rear glass plate at which the rib part 92 is provided. As shown in FIG. 9C, the thickness t3 of the rib part is smaller than the thickness t1 of the rear glass plate. However, as discussed above with reference to FIG. 9B, even if the part which is to serve as the rib is not subjected to the sand blasting and the thickness t1 and the thickness t3 is substantially equivalent to each other, the pressure inside the display device is made positive, to thereby make it possible to provide an enough space between the substrate 1 and the rib.

In the fourth embodiment, the cross-shaped rib part 92 which is the thick part of the rear glass plate is provided at the center part of the rear glass plate, so that it is possible to reduce the deflection amount of the rear glass plate and prevent the cross-shaped rib part from contacting the organic EL film 3 and the desiccant members 5. Moreover, the parts of the rear glass plate in which the desiccant members 5 are installed are thin in its plate-thickness, so that the weight of the entire display device can be reduced.

Fifth Embodiment

Figure 10A:
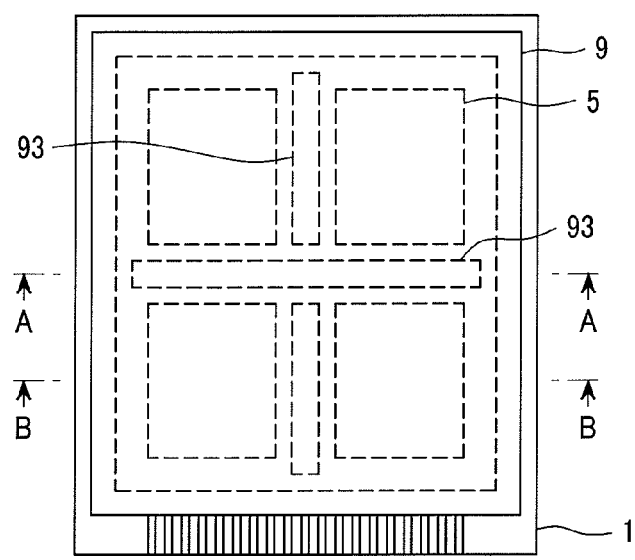
FIG. 10A is a schematic rear view of a display device according to a fifth embodiment of the present invention.
Figure 10B:
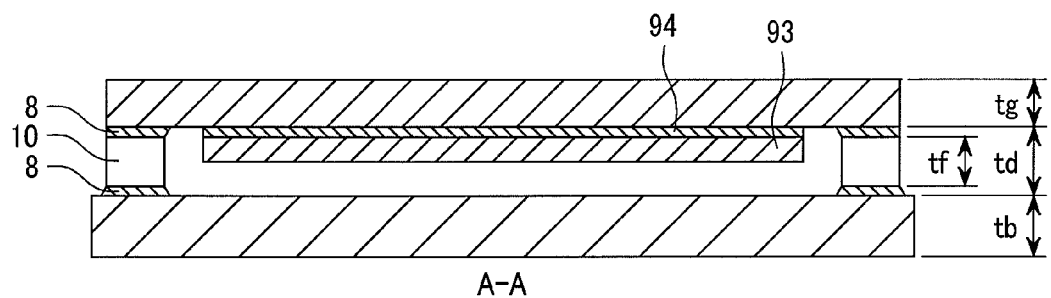
FIG. 10B is a schematic enlarged sectional view of the fifth embodiment, taken along a line A-A in FIG. 10A.
Figure 10C:
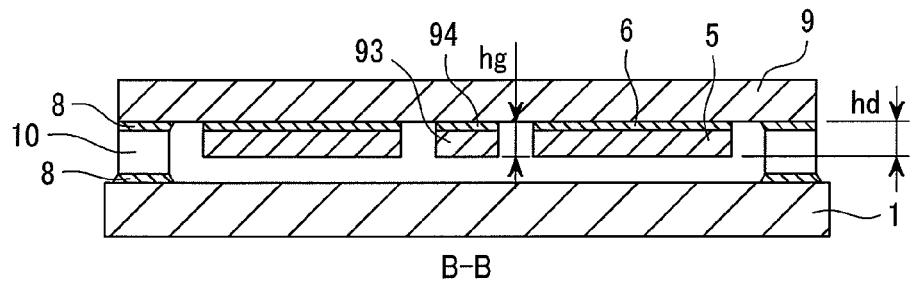
FIG. 10C is a schematic enlarged sectional view of the fifth embodiment, taken along a line B-B in FIG. 10A.

FIGS. 10A, 10B and 10C each illustrate a fifth embodiment according to the present invention. FIG. 10A is a schematic plan view of the display device according to the fifth embodiment, as viewed from the side of the rear glass plate 9. FIG. 10B is a schematic enlarged sectional view of the fifth embodiment, taken along a line A-A in FIG. 10A. FIG. 10C is a schematic enlarged sectional view of the fifth embodiment, taken along a line B-B in FIG. 10A. In the fourth embodiment, the spaces in which the desiccant members 5 are to be installed are formed in the rear glass plate by causing the plate-shaped piece of glass to be partially shaved by the sand blasting. In the fifth embodiment, the rear glass plate is merely formed from a plate-shaped piece of glass. In this embodiment, the glass piece for the rear glass plate is not subjected to the sand blasting process, so that it is possible to omit such a step and manufacture a display device utilizing relatively simple components.

As shown in FIG. 10A, a first elongated glass plate 93 is bonded to the rear glass plate so as to be arranged in the vicinity of the minor axis of the display device. In this embodiment, the first elongated glass plate 93 serves as a rib which prevents the deflection of the rear glass plate 9. Moreover, two second elongated glass plates 93 which also serve as ribs are arranged on the major axis of the rear glass plate so as to interpose the first elongated glass plate 93 on the minor axis therebetween. Such a structure is fully shown in FIGS. 10B and 10C. The first elongated glass plate 93 and the second elongated glass plates 93 which serve as the ribs on the minor axis and the major axis, respectively, make plate-thicknesses of the parts of the rear glass plate at which the first and second elongated plates 93 are provided, substantially thick, thus making it possible to reduce the deflection amount of the rear glass plate. Incidentally, while the first and second elongated glass plates 93 will be hereinafter referred to as members that serve as the ribs, the elongated glass plates are merely illustrative examples. As far as the members that serve as the ribs provide rigidity, the members are not limited to the elongated glass plates.

In the example shown in FIGS. 10B and 10C, the first elongated glass plate 93 and the second elongated glass plates 93 which serve as the ribs on the minor axis and the major axis, respectively, are bonded onto the rear glass plate by adhesive members 94 before the rear glass plate is bonded to the substrate 1 on which the organic EL film and the like are provided. The adhesion of the first and second elongated glass plates 93 to the rear glass plate does not exert an effect on the organic EL material and the like, so that an epoxy resin or the like which can performs the adhesion at high temperatures and provide strong adhesion may be employed, or fritted glass may be used in order to bond the elongated glass plates to the rear glass plate.

After the elongated glass plates are bonded to the rear glass plate, the rear glass plate having the ribs bonded thereon is sealingly bonded to the substrate through a sealing frame 10 interposed between the rear glass plate and the substrate, by sealing members 8 on both surfaces of the sealing frame 10. The total thickness of a thickness tf of the sealing frame 10 and thicknesses of the sealing members 8 corresponds to a space between the substrate 1 and the rear glass plate. The organic EL material provided on the substrate 1 is poor in resistance to high temperature and ultraviolet rays, so that if thermosetting sealing members are used as the sealing members 8, it is necessary to use thermosetting sealing members which can display their capacities at a temperature of 80° C. or less. Moreover, if ultraviolet-rays hardenable sealing-members are employed as the sealing members 8, it is necessary not to irradiate the organic EL material with ultraviolet rays.

The total thickness hg of the elongated glass plate 93 acting as the rib, and the adhesive member 94 may be made equivalent to or slightly larger than the total thickness hd of the desiccant member 5 and the double-sided adhesive tape. In the example shown in FIGS. 10B and 10C, a difference between a distance td between the substrate 1 and the rear glass plate, and the height hg of the elongated glass plate corresponds to a permitted limit in which the deflection of the rear glass plate is allowed. The advantage of this embodiment is to be able to relatively easily change the distance td between the substrate 1 and the rear glass plate by changing the height tf of the sealing frame 10.

The dimension of the structure of this embodiment is as follows. The thickness tb of the substrate 1 is 0.7 mm. The thickness tg of the rear glass plate is 0.3 mm. A height measured between the substrate 1 and an upper surface of the rear glass plate is 0.8 mm. A distance corresponding to the total thickness of the sealing frame 10 provided at a peripheral part of the substrate 1, and the two sealing members 8 is 0.5 mm. Of these thicknesses, the thickness of the sealing frame 10 is 0.44 mm and the total thickness of the two sealing members 8 is 0.06 mm. The thickness of the elongated glass plate provided at the center part of the display device and serving as the rib is 0.3 mm. The thickness of the adhesive member 94 is 0.03 mm. Therefore, it is possible to take a distance of 0.17 mm between the substrate 1 and the elongated glass plate acting as the rib. Moreover, the deflection amount of the rear glass plate can be considerably reduced by the first and second elongated glass plates 93 acting as the ribs, so that even if there is only such a small distance, it is possible to avoid the contact of the ribs or the desiccant members 5 with the organic EL film. The characteristic of this embodiment lies in that the plate-thickness of the rear glass plate and the thickness of the elongated glass plate 93 acting as the rib are made same. For this reason, it is possible to suppress the costs of component materials.

In this embodiment, the total thickness of the desiccant member 5 and the double-sided adhesive tape 6 for bonding the desiccant member 5 to the rear glass plate, can be made as relatively large as 0.33 mm.

Sixth Embodiment

Figure 11:
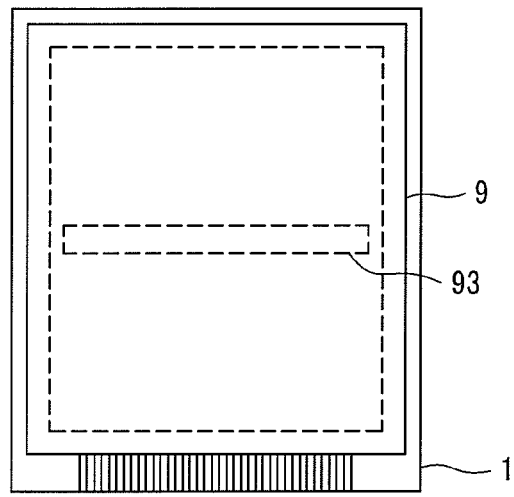
FIG. 11 is a schematic rear view of a display device according to a sixth embodiment of the present invention.
Figure 12:
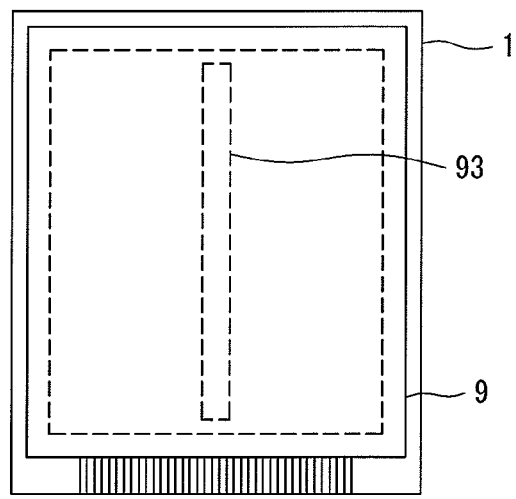
FIG. 12 is a schematic rear view of a modification of the sixth embodiment.

While the fifth embodiment is an example in which a cross-shaped rib is formed on the rear glass plate by using the elongated glass plates, and the four desiccant members 5 are employed, there are different variations of modes for bonding the first and second elongated glass plates 93 to the rear glass plate 9 to thereby form a rib or ribs. FIGS. 11 and 12 each illustrate a relatively small-sized display device in which an elongated glass plate 93 is bonded onto the rear glass plate 9, whereby a rib is provided. In the example shown in FIG. 11, the elongated glass plate 93 is bonded onto the minor axis of the rear glass plate 9. In the example shown in FIG. 12, the elongated glass plate 93 is bonded onto the major axis of the rear glass plate 9. The bonding process of the rib, the combination of the rib to the display device and the like are the same as in the fifth embodiment.

Figure 13:
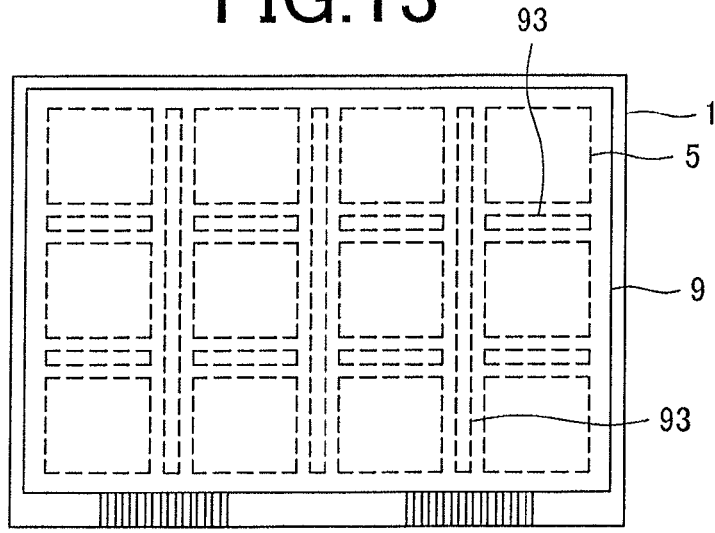
FIG. 13 is a schematic rear view of another modification of the sixth embodiment.
Figure 14:
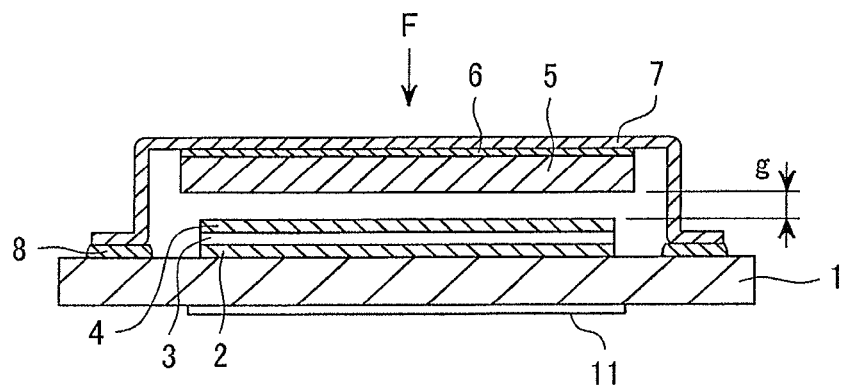
FIG. 14 is a schematic sectional view of a conventional display device.
Figure 15:
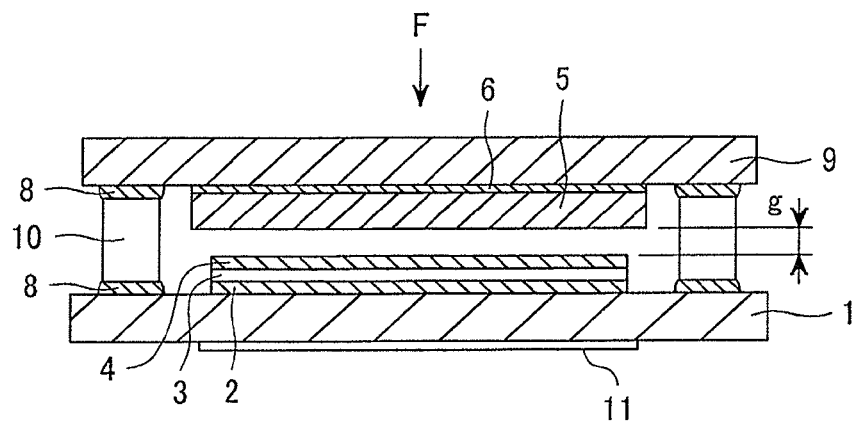
FIG. 15 is a schematic sectional view of another conventional display device.

FIG. 13 is a schematic plan view of a relatively large-sized display device in which elongated glass plates 93 are provided on the rear glass plate 9 as ribs. In the example shown in FIG. 13, two kinds of elongated glass plates 93 including elongated glass plates 93 parallel to the minor axis and elongated glass plate 93 parallel to the major axis are employed. The width and thickness of the elongated glass plate 93 may be fixed in light of a request for the degree of the deflection amount and the thickness and external size of the desiccant member 5 to be installed.

It is economically advantageous to employ a plurality of relatively small-sized, standardized desiccant members 5 rather than to employ a large-sized desiccant member specially manufactured. Moreover, a plurality of ribs can be in turn provided. While the embodiment shown in FIG. 13 employs, as the ribs, the elongated glass plates 93 including the elongated glass plates 93 parallel to the minor axis and the elongated glass plate 93 parallel to the major axis, the embodiment is not limited to such a structure. Only the elongated glass plates 93 parallel to the major axis may be employed or only the elongated glass plates 93 parallel to the minor axis may be employed, according to a shape of a screen of the display device, and the like. The process of providing the ribs utilizing the elongated glass plates 93 is carried out in the manner as in the process of the fifth embodiment.

This embodiment gives effect, especially when a display device is made large-sized. That is, if the thickness of the rear glass plate is increased in order to add strength of the rear glass plate, not only the thickness of the entire display device is increased but also the weight of the display device is increased. According to this embodiment, parts of the rear glass plate which are substantially increased in thickness are only the parts of the rear glass plate at which the ribs are provided, so that the weight of the rear glass plate can be in turn reduced.

When the display device is large-sized, this embodiment has also an advantage relative to the fourth embodiment. That is, if the recess portions are formed in a large-sized rear glass plate by the sand blasting process as discussed above in connection with the fourth embodiment, the device is made large-sized. From this point, the cost of the device is increased. In contrast with this, this embodiment can be assembled from the simple components, so that it can also provide an advantage in production equipment for this embodiment. Moreover, to assemble the simple components, to thereby solve the above problems, is to also provide the advantage of being able to flexibly deal with display devices having various sizes.

What is claimed is:

1. An organic electroluminescence display device comprising:
    a substrate having a screen provided thereat;
    an organic electroluminescence layer arranged in matrix form on a surface of the substrate and adapted to emit light when voltage is applied to the organic electroluminescence layer;
    the organic electroluminescence display device being adapted to produce an image on the screen when voltage is applied to the organic electroluminescence layer and the organic electroluminescence layer then emit the light;
    a rear glass plate sealingly bonded through a sealing frame to the surface of the substrate by sealing members, whereby an interior of the organic electroluminescence display device is hermetically sealed;
    elongated plate means bonded on an inner surface of the rear glass plate so as to traverse the screen when the display device is superficially viewed; and
    desiccant means installed on an area of the inner surface of the rear glass plate on which the elongated plate means is not provided.

2. An organic electroluminescence display device according to claim 1, wherein the elongated plate means comprises glass plate means.

3. An organic electroluminescence display device according to claim 1, wherein the elongate plate means is provided so as to be substantially parallel to a minor axis of the display device.

4. An organic electroluminescence display device according to claim 1, wherein the elongated plate means is formed so as to be substantially parallel to a major axis of the display device.

5. An organic electroluminescence display device according to claim 1, wherein the elongated plate means comprises elongated plates substantially parallel to a minor axis of the display device, and elongated plates substantially parallel to a major axis of the display device.

6. An organic electroluminescence display device according to claim 1, wherein a distance between the elongated plate means and the substrate is smaller than a distance between the desiccant means and the substrate.

7. An organic electroluminescence display device comprising:
    a substrate having a display region provided thereon;
    an organic electroluminescence layer arranged in a matrix form on a surface of the substrate over the display region of the substrate so as to emit light in response to an application of a voltage;
    a rear glass plate having an outer perimeter sealingly bonded to the surface of the substrate by a sealing member, and arranged to cover the display region of the substrate;
    elongated plate means bonded to an inner surface of the rear glass plate so as to traverse the display region; and
    desiccant means installed on designated areas of the inner surface of the rear glass plate where the elongated plate means is not bonded,
    wherein the organic electroluminescence display device is adapted to produce an image on the display region when the voltage is applied to the organic electroluminescence layer and light is emitted from the organic electroluminescence layer.

8. An organic electroluminescence display device according to claim 7, wherein the elongated plate means comprises:
    a first elongated glass plate arranged parallel to a minor axis of the display device; and
    a pair of second elongated glass plate arranged parallel to a major axis of the display device so as to interpose the first elongated glass plate,
    wherein the first and second elongated glass plate serve as ribs on the minor axis and the major axis to prevent deflection of the rear glass plate.

9. An organic electroluminescence display device according to claim 7, wherein the elongate plate means is provided so as to be substantially parallel to a minor axis of the display device.

10. An organic electroluminescence display device according to claim 7, wherein the elongated plate means is formed so as to be substantially parallel to a major axis of the display device.

11. An organic electroluminescence display device according to claim 7, wherein the elongated plate means comprises elongated plates substantially parallel to a minor axis of the display device, and elongated plates substantially parallel to a major axis of the display device.

12. An organic electroluminescence display device according to claim 7, wherein a distance between the elongated plate means and the substrate is smaller than a distance between the desiccant means and the substrate.

13. An organic electroluminescence display device according to claim 8, wherein a distance between the elongated plate means and the substrate is smaller than a distance between the desiccant means and the substrate.

* * * * *